(12) United States Patent
Lee et al.

(10) Patent No.: US 10,276,433 B2
(45) Date of Patent: Apr. 30, 2019

(54) METHOD FOR FABRICATING PLANARIZATION LAYER

(71) Applicant: Chunghwa Picture Tubes, LTD., Taoyuan (TW)

(72) Inventors: Wei-Hsin Lee, Taoyuan (TW); Chin-Tzu Kao, Changhua County (TW)

(73) Assignee: Chunghwa Picture Tubes, LTD., Taoyuan (TW)

( * ) Notice: Subject to any disclaimer, the term of this patent is extended or adjusted under 35 U.S.C. 154(b) by 0 days.

(21) Appl. No.: 15/820,450

(22) Filed: Nov. 22, 2017

(65) Prior Publication Data
US 2019/0088533 A1 Mar. 21, 2019

(30) Foreign Application Priority Data
Sep. 21, 2017 (CN) .......................... 2017 1 0856781

(51) Int. Cl.
| | |
|---|---|
| *H01L 21/768* | (2006.01) |
| *H01L 21/027* | (2006.01) |
| *G03F 7/038* | (2006.01) |
| *G03F 7/16* | (2006.01) |
| *G03F 7/20* | (2006.01) |
| *G03F 7/26* | (2006.01) |
| *G03F 7/039* | (2006.01) |
| *H01L 29/786* | (2006.01) |

(Continued)

(52) U.S. Cl.
CPC .......... *H01L 21/7688* (2013.01); *G03F 7/038* (2013.01); *G03F 7/039* (2013.01); *G03F 7/162* (2013.01); *G03F 7/168* (2013.01); *G03F 7/2002* (2013.01); *G03F 7/26* (2013.01); *H01L 21/0272* (2013.01); *H01L 21/0273* (2013.01); *G06F 3/044* (2013.01); *G06F 2203/04103* (2013.01); *H01L 29/7869* (2013.01); *H01L 29/78654* (2013.01); *H01L 29/78669* (2013.01); *H01L 29/78678* (2013.01); *H01L 51/0566* (2013.01)

(58) Field of Classification Search
CPC combination set(s) only.
See application file for complete search history.

(56) References Cited

U.S. PATENT DOCUMENTS

| | | |
|---|---|---|
| 9,123,598 B2 | 9/2015 | Lee et al. |
| 2005/0219433 A1* | 10/2005 | Oh ...................... G02F 1/13458 349/42 |

(Continued)

FOREIGN PATENT DOCUMENTS

CN  103809320  5/2014

*Primary Examiner* — Mamadou L Diallo
(74) *Attorney, Agent, or Firm* — JCIPRNET

(57) ABSTRACT

A method for fabricating a planarization layer includes: forming an active device on a substrate; covering the active device with a passivation layer; forming a pad layer on the passivation layer; forming an overcoating layer covering the passivation layer and the pad layer on the substrate; and removing a portion of the overcoating layer and the pad layer by an exposure and development process to form a patterned overcoating layer, wherein the patterned overcoating layer has an opening exposing the passivation layer on a position relative to the active device. The method for fabricating the planarization layer of the disclosure may save exposure to enhance productivity.

8 Claims, 16 Drawing Sheets

(51) Int. Cl.
*H01L 51/05* (2006.01)
*G06F 3/044* (2006.01)

(56) References Cited

U.S. PATENT DOCUMENTS

2010/0289977 A1* 11/2010 Liu .................... G02F 1/1362
  349/44
2014/0008656 A1* 1/2014 Shim ................ H01L 29/66765
  257/59

* cited by examiner

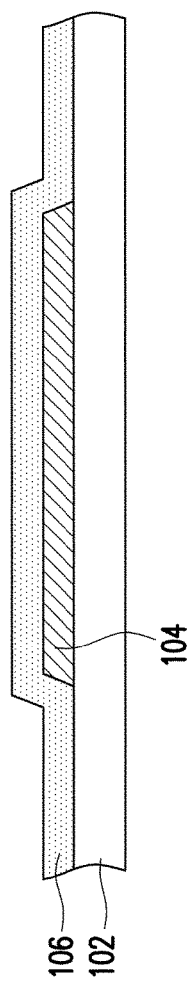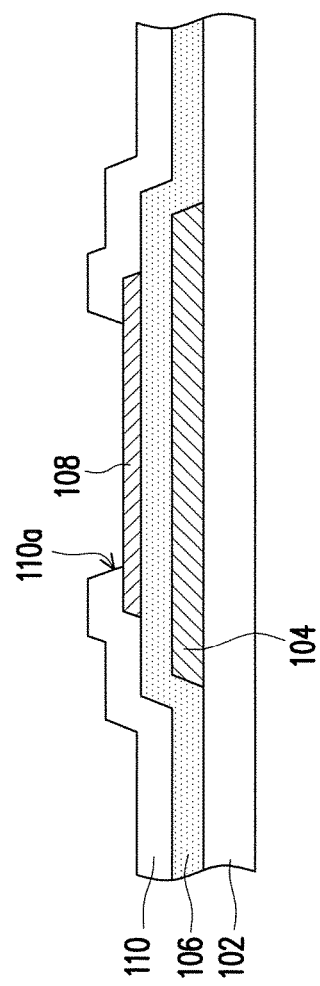

METHOD FOR FABRICATING PLANARIZATION LAYER

CROSS-REFERENCE TO RELATED APPLICATION

This application claims the priority benefit of China application serial no. 201710856781.8, filed on Sep. 21, 2017. The entirety of the above-mentioned patent application is hereby incorporated by reference herein and made a part of this specification.

BACKGROUND OF THE INVENTION

Field of the Invention

The invention relates to a semiconductor process and particularly relates to a method for fabricating a planarization layer.

Description of Related Art

Generally speaking, in a portion of display device having a touch function, a common electrode in the display device would be divided into multiple blocks, and the common electrodes in each of the blocks are collectively used as a touch electrode. Herein, in the case of a Mid-Corn structure, an organic photoresist layer having a certain thickness must exist between the source/drain of the active device and the common electrode so as to reduce a capacitance effect between the source/drain and the common electrode, thereby providing good component properties.

However, since the thickness of the organic photoresist layer increases, the required exposure is also significantly increased, thereby affecting productivity. Consequently, how to reduce the exposure of the organic photoresist layer to enhance productivity has become an important issue that needs to be addressed in the current field.

SUMMARY OF THE INVENTION

The invention provides a method for fabricating a planarization layer that may save exposure to enhance productivity.

An embodiment of the invention provides a method for fabricating a planarization layer, including: forming an active device on a substrate; covering the active device with a passivation layer; forming a pad layer on the passivation layer; forming an overcoating layer covering the passivation layer and the pad layer on the substrate; and removing a portion of the overcoating layer and the pad layer by an exposure and development process to form a patterned overcoating layer, wherein the patterned overcoating layer has an opening exposing the passivation layer on a position relative to the active device.

According to an embodiment of the invention, after the pad layer is formed on the passivation layer, a vacuum drying process or a baking process is not performed on the pad layer.

According to an embodiment of the invention, materials of the overcoating layer and the pad layer are different from each other.

According to an embodiment of the invention, the overcoating layer and the pad layer include a photoresist material, wherein light sensitivity of the overcoating layer is A and the light sensitivity of the pad layer is B, and $B/A \geq 7$.

According to an embodiment of the invention, after the patterned overcoating layer is formed, a patterned electrode is formed on the patterned overcoating layer, wherein the patterned electrode is not formed in the opening.

According to an embodiment of the invention, forming the patterned electrode includes: forming an electrode on the patterned overcoating layer and on a surface of the opening; covering the electrode with a negative photoresist layer, wherein the negative photoresist layer fills up the opening; performing an exposure and development process on the negative photoresist layer to form a patterned negative photoresist layer, wherein the patterned negative photoresist layer exposes the electrode in the opening; and removing the electrode exposed by the patterned negative photoresist layer to form the patterned electrode.

According to an embodiment of the invention, a depth of the negative photoresist layer in the opening is t1, a depth of the negative photoresist layer surrounding the opening is t2, and $t1/t2 \geq 2.5$.

According to an embodiment of the invention, forming the patterned electrode includes: filling a positive photoresist layer n the opening; forming an electrode on the patterned overcoating layer and on the positive photoresist layer; and removing the positive photoresist layer by a lift-off process, so that the electrode on the positive photoresist layer is also removed simultaneously to form the patterned electrode.

According to an embodiment of the invention, forming the patterned electrode includes: filling a first positive photoresist layer in the opening; forming an electrode on the patterned overcoating layer and on the first positive photoresist layer; forming a second positive photoresist layer on the electrode; performing an exposure and development process on the second positive photoresist layer to form a patterned second positive photoresist layer, wherein the patterned second positive photoresist layer exposes the electrode in the opening; and removing the electrode exposed by the patterned second positive photoresist layer to form the patterned electrode.

Based on the above, in the method for fabricating the planarization layer as described in the foregoing embodiments of the invention, before the overcoating layer is formed, the pad layer is formed at the position where the exposure process is to be performed on the overcoating layer so that the overcoating layer there has a thinner thickness, thereby reducing the exposure at the position where the exposure process is to be performed on the overcoating layer. As a result, tact time is saved and productivity is enhanced.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

FIGS. 1A to 1E are schematic cross-sectional views showing a method for fabricating a planarization layer according to an embodiment of the invention.

DESCRIPTION OF THE EMBODIMENTS

Figure 1C:
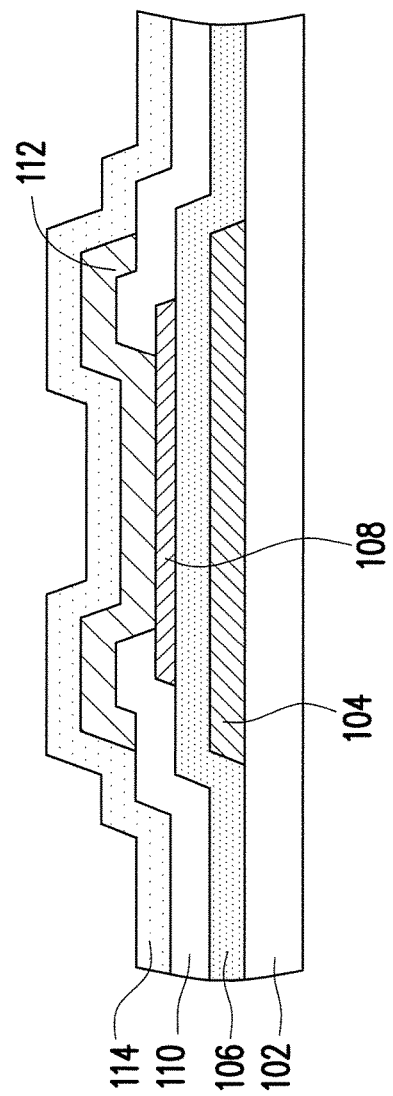

Detailed descriptions of the invention are given hereinafter with reference to the exemplary embodiments illustrated by the drawings. Wherever possible, the same reference numerals are used in the drawings and the description to refer to the same or similar parts.

Please refer to the drawings along with the embodiments for a more complete description. However, the invention may also be embodied in various different forms and should not be construed as being limited to the embodiments set forth hereinafter. In the drawings, thicknesses of layers and regions may be enlarged to facilitate understanding. The same or similar reference numerals are used to refer to the same or similar components, a point that will not be repeated hereinafter.

FIGS. 1A to 1E are schematic cross-sectional views showing a method for fabricating a planarization layer according to an embodiment of the invention.

With reference to FIGS. 1A to 1E, an active device 113 is formed on a substrate 102. The active device 113 includes a gate 104, a gate insulating layer 106, a semiconductor layer 108, and a source/drain 112. In some embodiments, the gate 104, the gate insulating layer 106, the semiconductor layer 108 and the source/drain 112 are sequentially stacked on the substrate 102 to form a thin film transistor of a bottom gate structure. In some embodiments, a material of the substrate 102 may be an inorganic material. For example, the inorganic material may be a glass material such as soda-lime glass, quartz glass or sapphire glass, or a metal material of various metals such as stainless steel, aluminum or nickel or an alloy thereof. In some other embodiments, the material of the substrate 102 may also be an organic material. For example, the organic material may be polymethyl methacrylate (PMMA), polyvinyl alcohol (PVA), polyvinyl phenol (PVP), polyether sulfone (PES), polyimide (PI), polyamide (PA), polyoxymethylene (POM), poly carbonate (PC), polyethylene terephthalate (PET), polyethylene naphthalate (PEN), or a combination thereof. In other embodiments, the material of the substrate 102 may also be a flexible material, such as polyimide (PI). In addition, in some embodiments, the following process may be used to form the active device 113 on the substrate 102.

First of all, with reference to FIG. 1A, the gate 104 is formed on the substrate 102. In some embodiments, a material of the gate 104 may be a conductive material. The conductive material is, for example, metal, conductive metal oxide, conductive polymer, a conductive composite material, or a combination thereof. For example, the metal may be platinum, gold, silver, aluminum, chromium, nickel, copper, molybdenum, titanium, magnesium, calcium, barium, sodium, palladium, iron, manganese, or a combination thereof. The conductive metal oxide may be $InO_2$, $SnO_2$, indium-tin oxide (ITO), fluorine-tin oxide (FTO), aluminum-zinc oxide (AZO), gallium-zinc oxide (GZO), or a combination thereof. The conductive polymer may be polyaniline, polypyrrole, polythiophene, polyacetylene, poly(3,4-ethylenedioxythiophene)/polystyrene sulfonate (PEDOT/PSS), or a combination thereof. In addition, the conductive polymer may also be a dopant in which an acid such as hydrochloric acid, sulfuric acid or sulfonic acid, a Lewis acid such as $PF_6$, $AsF_5$ or $FeCl_3$, a halogen atom such as iodine, or a metal atom such as sodium or potassium is added into the conductive polymer. The conductive composite material may be a conductive composite material in which carbon black, graphite powder, and fine metal particles are dispersed. The method of forming the gate 104 is, for example, physical vapor deposition (PVD), chemical vapor deposition (CVD), spin coating, or a combination thereof.

Then, the gate insulating layer 106 that covers the gate 104 is formed on the substrate 102. A material of the gate insulating layer 106 may be silicon oxide, silicon oxynitride, silicon nitride or other suitable insulating materials (such as an organic polymer compound), or a combination of the foregoing materials. The method of forming the gate insulating layer 106 is, for example, physical vapor deposition (PVD), chemical vapor deposition (CVD), spin coating, or a combination thereof.

Then, with reference to FIG. 1B, the semiconductor layer 108 is formed on the gate insulating layer 106. A material of the semiconductor layer 108 may be amorphous silicon, polycrystalline silicon, microcrystalline silicon, monocrystalline silicon, an oxide semiconductor material, an organic silicon material, an organic oxide semiconductor material, or a combination thereof. The method of forming the semiconductor layer 108 is, for example, PVD, CVD, or a combination thereof. In some embodiments, the semiconductor layer 108 may include an ohm contact layer and a channel layer.

Next, an insulating layer 110 is formed on the semiconductor layer 108. Herein the insulating layer 110 has an opening 110a that exposes a portion of the semiconductor layer 108. A material of the insulating layer 110 is, for example, silicon oxide, silicon oxynitride, silicon nitride, an organic insulating material, or a combination thereof. The method of forming the insulating layer 110 is, for example, PVD, CVD, spin coating, or a combination thereof.

Afterwards, with reference to FIG. 1C, the source/drain 112 is formed on the insulating layer 110 and fills in the opening 110a to form the active device 113 on the substrate 102. A material of the source/drain 112 may include metal, conductive oxide, or a combination thereof. For example, the metal may be Ti, Pt, Ru, Au, Ag, Mo, Al, W, Cu, Nd, Cr, Ta or an alloy thereof, or a combination of the foregoing materials. The conductive oxide may be IZO, AZO, ITO, GZO, ZTO, or a combination thereof. In some embodiments, the method of forming the source/drain 112 may include forming a source/drain material layer (not shown) on the insulating layer 110 first. Next, with the insulating layer 110 serving as an etching stop layer, a portion of the source/drain material layer is removed to form the source/drain 112 in the opening 110a and on the insulating layer 110 surrounding the opening 110a. In other words, the insulating layer 110 may be used to prevent the film layer underneath the insulating layer 110 from being damaged during the etching process of forming the source/drain 112. The method of forming the source/drain material layer is, for example, PVD, CVD, or a combination thereof. The method of removing a portion of the source/drain material layer is, for example, dry etching, wet etching, or a combination thereof.

Then, after the active device 113 is formed on the substrate 102, the active device 113 is covered with a passivation layer 114. A material of the passivation layer 114 may be silicon oxide, silicon oxynitride, silicon nitride, an organic material, or a combination thereof. The method of forming the passivation layer 114 may be PVD, CVD, spin coating, or a combination thereof.

Figure 1D:
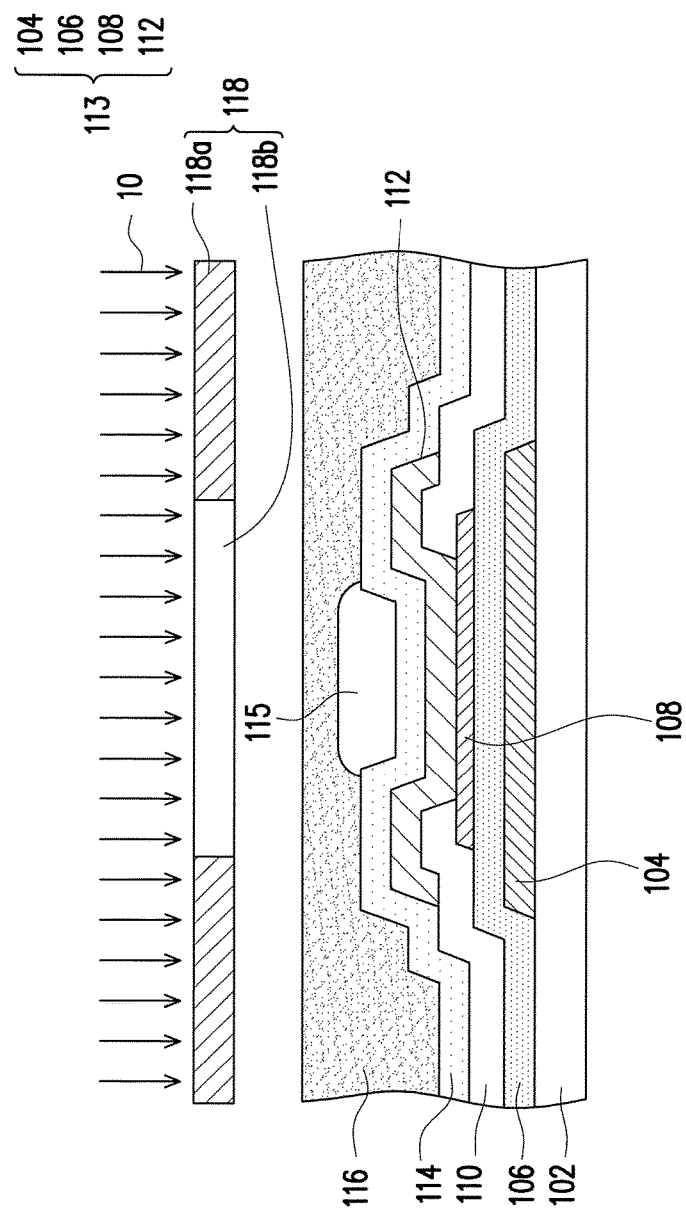
Figure 1E:
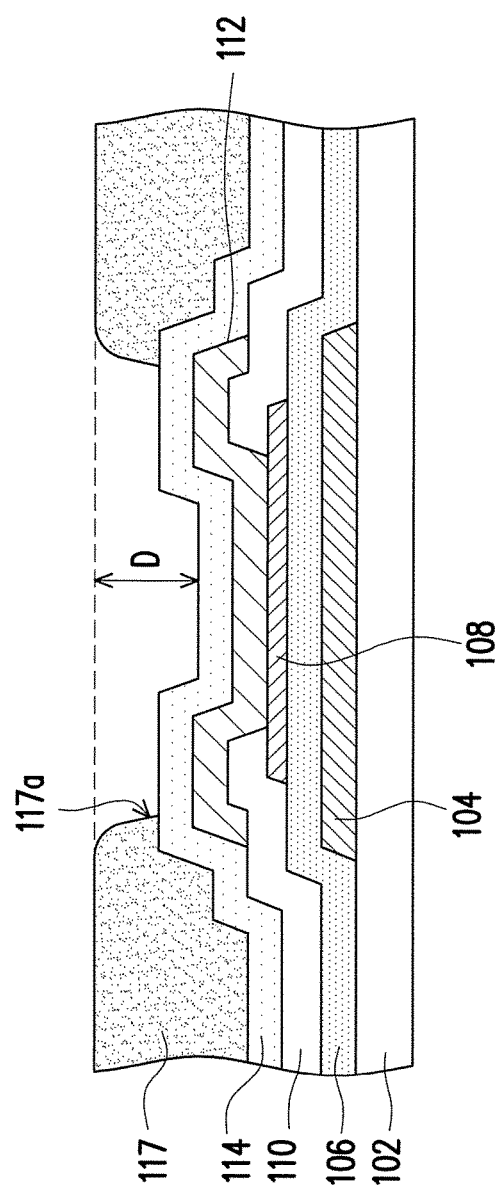

With reference to FIGS. 1D and 1E, a pad layer 115 is formed on the passivation layer 114. Herein the pad layer 115 overlaps on the active device 113, and the size of the pad layer 115 is about smaller than that of an opening 117a of a patterned overcoating layer 117 to be formed by the subsequent process (as shown in FIG. 1E). In some embodiments, a material of the pad layer 115 may be a photoresist material such as phenolic resin, and the forming method thereof is, for example, spin coating. Then, an overcoating layer 116 that covers the passivation layer 114 and the pad layer 115 is formed on the substrate 102. In some embodiments, a material of the overcoating layer 116 may be a photoresist material such as acrylic resin, and the forming method thereof is, for example, spin coating. Next, a patterned photomask 118 is provided on the overcoating layer 116. The patterned photomask 118 includes a light-blocking region 118a and a light-transmitting region 118b, and the light-transmitting region 118b corresponds to the position of the active device 113. Then, an exposure process 10 is performed on the overcoating layer 116 by the patterned photomask 118, so that a light is irradiated through the light-transmitting region 118b to a portion of the passivation layer 114 and the pad layer 115 underneath the overcoating layer 116. Then, the exposed portion of the passivation layer 114 and the exposed pad layer 115 underneath the overcoating layer 116 are removed by a development process to form the patterned overcoating layer 117. The patterned overcoating layer 117 has the opening 117a exposing the passivation layer 114 on a position relative to the active device 113. In this way, since the pad layer 115 exists between the overcoating layer 116, which overlaps on the active device 113, and the active device 113, the thickness of the overcoating layer 116 here may thus be reduced, so that the required exposure is reduced when the exposure process 10 is performed on the overcoating layer 116 here. As a result, tact time is lessened and productivity is enhanced. In some embodiments, the overcoating layer 116 is an organic material so that a capacitance effect between the source/drain and the common electrode may be reduced, thereby providing good component properties. In some embodiments, compared to the top surface of the passivation layer 114, sidewalls of the opening 117a exhibit two different angles (not shown) adjacent to the bottom surface of the opening 117a. In addition, in some embodiments, the pad layer 115 and the overcoating layer 116 are different positive photoresist materials. Herein light sensitivity B of the pad layer 115 is greater than light sensitivity A of the overcoating layer 116. For example, in the case where the material of the pad layer 115 is phenolic resin and the material of the overcoating layer 116 is acrylic resin, under the same exposure condition, the exposure required for the pad layer 115 is about 35 mJ/cm$^2$ and the exposure required for the overcoating layer 116 is about 280 mJ/cm$^2$. In other words, the ratio (B/A) of the light sensitivity of the pad layer 115 to the light sensitivity of the overcoating layer 116 is greater or equal to 7. In this way, even if the thickness of the area to be exposed is increased, the original exposure of the area (i.e. the exposure before the thickness is increased) may still be maintained, and the exposure of the area may even be further reduced; for example, the required exposure may be reduced from 280 mJ/cm$^2$ to about 70 mJ/cm$^2$. In this way, by a single exposure and development process, a portion of the overcoating layer 116 and the pad layer 115 underneath the overcoating layer 116 may easily be removed simultaneously to form the patterned overcoating layer 117 with a thicker thickness (the opening 117a correspondingly has a thicker thickness D which is greater than 20000 Å, for example), thereby reducing the capacitance effect between the source/drain 112 and the common electrode (i.e. the patterned electrode 119a) that is to be formed on the patterned overcoating layer 117 subsequently.

Besides, in some embodiments, after the pad layer 115 is formed on the passivation layer 114, a vacuum drying process or a baking process is selectively not performed on the pad layer 115, so that there are still some solvents or other additives in the pad layer 115 made of a positive photoresist material, resulting in a poor structure thereof (that is, it is easy to remove the pad layer 115 using a developer). In this way, even if the pad layer 115 underneath the overcoating layer 116 is not exposed to enough light (i.e. insufficient exposure), the pad layer 115 may still be removed by the development process. In other words, under the condition that the vacuum drying process or the baking process is not performed on the pad layer 115, the exposure required for the area to be exposed may be further saved. In some other embodiments, after the pad layer 115 is formed on the passivation layer 114, a post-back process in the vacuum drying process or the baking process is also selectively not performed on the pad layer 115, and only a pre-back process with a lower temperature is performed on the pad layer 115.

In the following, a fabricating method of forming a patterned electrode 119a on the patterned overcoating layer 117 is described with reference to FIGS. 2A to 2D according to an embodiment of the invention. In some embodiments, after the patterned electrode 119a is formed, the passivation layer 114 exposed by the opening 117a may also be removed to form a contact opening (not shown) exposing the active device 113. FIGS. 2A to 2D are schematic cross-sectional views showing a fabricating method of a patterned electrode according to an embodiment of the invention.

Figure 2A:
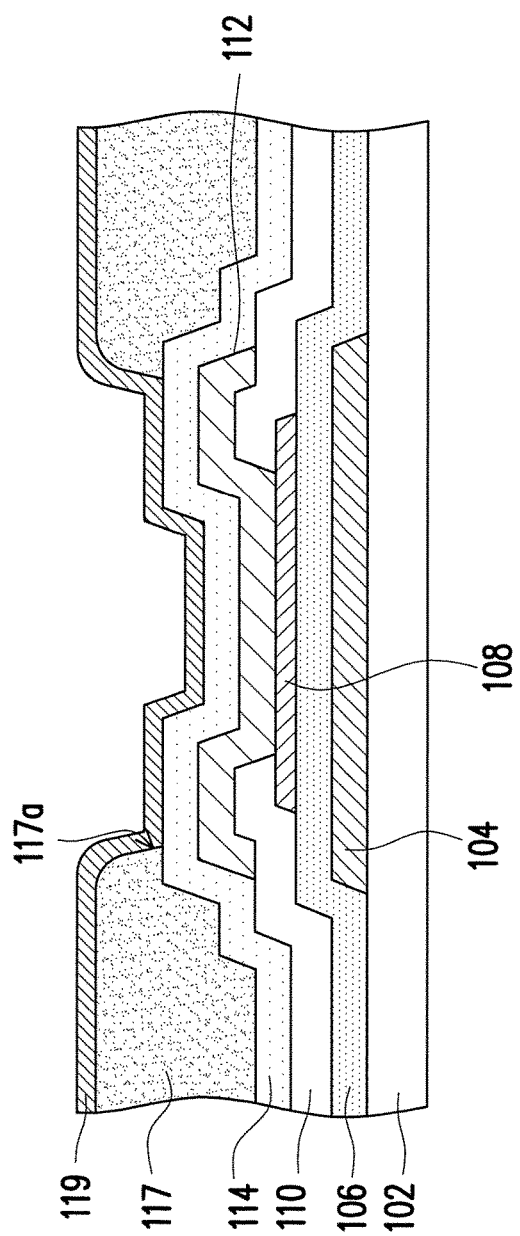
FIGS. 2A to 2D are schematic cross-sectional views showing a fabricating method of a patterned electrode according to an embodiment of the invention.

With reference to FIG. 2A, an electrode 119 is formed on the patterned overcoating layer 117 and on a surface of the opening 117a. A material of the electrode 119 may include metal, conductive oxide, or a combination thereof. For example, the metal may be Ti, Pt, Ru, Au, Ag, Mo, Al, W, Cu, Nd, Cr, Ta or an alloy thereof, or a combination of the foregoing materials. The conductive oxide may be IZO, AZO, ITO, GZO, ZTO, or a combination thereof. The method of forming the electrode 119 is, for example, PVD, CVD, or a combination thereof. In some embodiments, the electrode 119 is conformally formed on the patterned overcoating layer 117 and on the surface of the opening 117a.

Figure 2B:
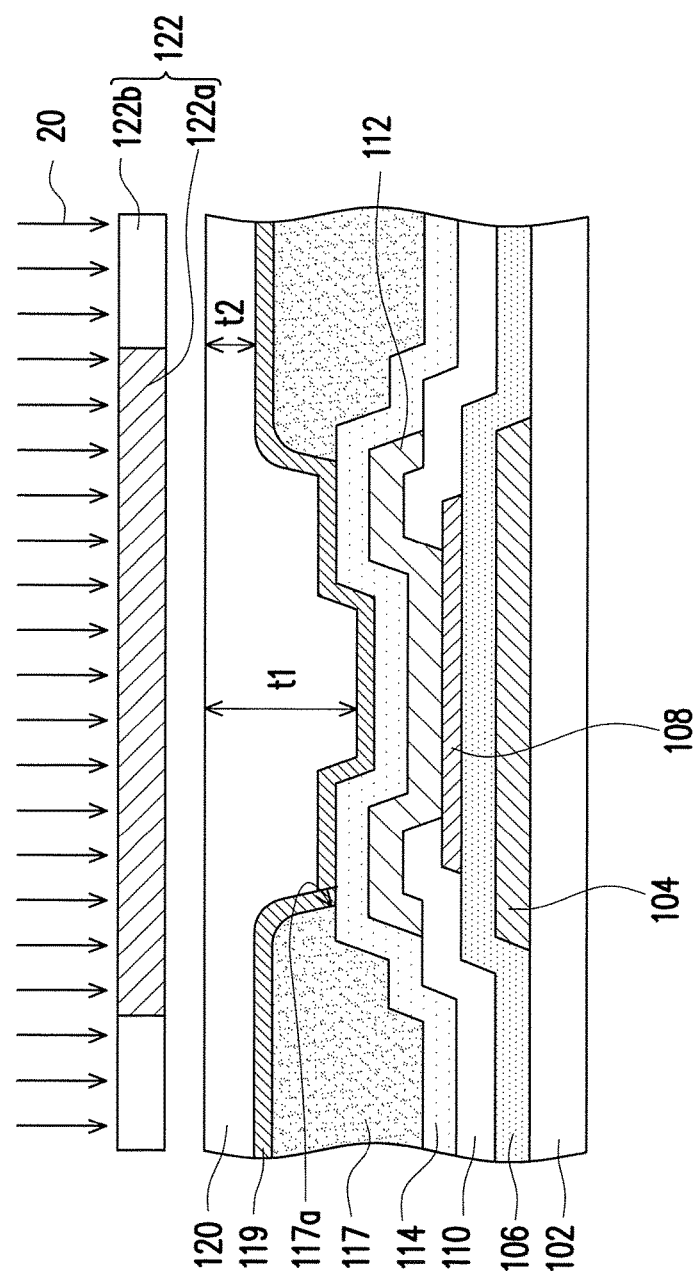
Figure 2C:
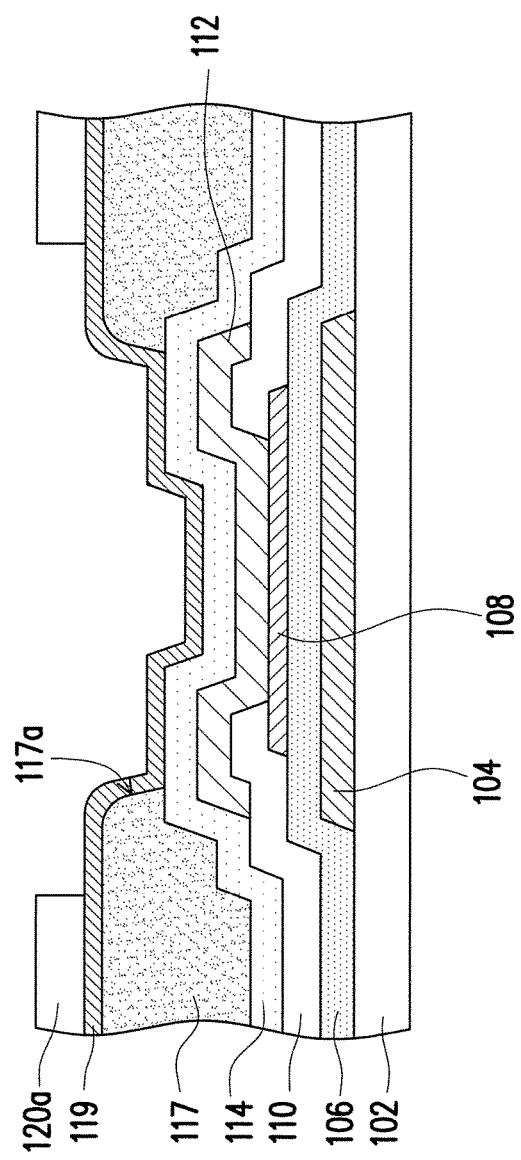

Then, with reference to FIGS. 2B and 2C, a negative photoresist layer 120 covers the electrode 119 and fills up the opening 117a. In some embodiments, the negative photoresist layer 120 may be formed using spin coating, but the invention is not limited thereto. Next, a patterned photomask 122 is provided on the negative photoresist layer 120. The patterned photomask 122 includes a light-blocking region 122a and a light-transmitting region 122b, and the light-transmitting region 122b corresponds to the negative photoresist layer 120 surrounding the opening 117a while the light-blocking region 122a corresponds to the position of the opening 117a. Then, an exposure process 20 is performed on the electrode 119 by the patterned photomask 122, so that a light is irradiated through the light-transmitting region 122b to the negative photoresist layer 120 surrounding the opening 117a. Next, a development process is performed on the negative photoresist layer 120 to form a patterned negative photoresist layer 120a. Herein the patterned negative photoresist layer 120a exposes the electrode 119 in the opening 117a. In other words, even if the negative photoresist layer 120 in the opening 117a has a thicker thickness (for example, 30000 Å) so as to greatly enhance the required exposure, but when the exposure process 20 is performed, exposure is not performed on the negative photoresist layer 120 there in the opening 117a but on the negative photoresist layer 120 that surrounds the opening 117a and has a thinner thickness (for example, 10000 Å). Consequently, even if the exposure is not increased, a patterned negative photoresist layer 120a with good resolution may also be formed. In this way, it is possible to alleviate the problem of the significantly increased exposure caused by the necessity of performing exposure on the thicker portion in the opening 117a when a positive photoresist is used. In some embodiments, a depth of the negative photoresist layer 120 in the opening 117a is t1, a depth of the negative photoresist layer 120 surrounding the opening 117a is t2, and t1/t2≥2.5.

Figure 2D:
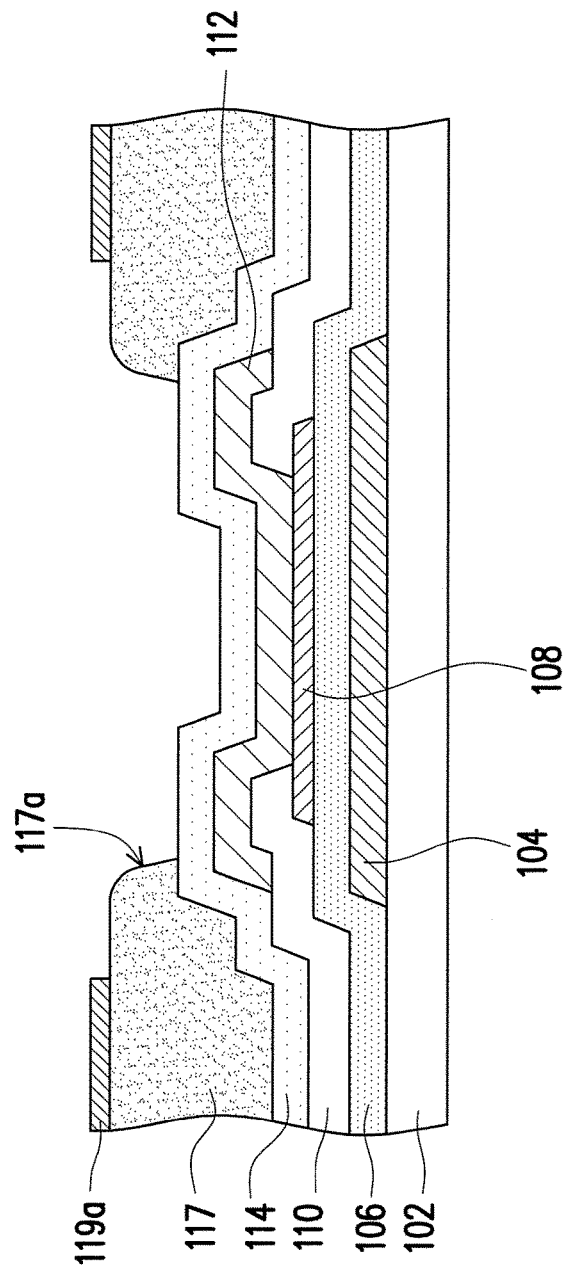

Then, with reference to FIGS. 2C and 2D, the electrode 119 exposed by the patterned negative photoresist layer 120a is removed to form the patterned electrode 119a, and herein the patterned electrode 119a is not formed in the opening 117a. In some embodiments, the electrode 119 exposed by the patterned negative photoresist layer 120a may be removed by performing an etching process. Herein the etching process is, for example, dry etching, wet etching, or a combination thereof.

In the following, a fabricating method of forming a patterned electrode 119a on the patterned overcoating layer 117 is described with reference to FIGS. 3A to 3D according to another embodiment of the invention. FIGS. 3A to 3D are schematic cross-sectional views showing a fabricating method of a patterned electrode according to another embodiment of the invention.

Figure 3A:
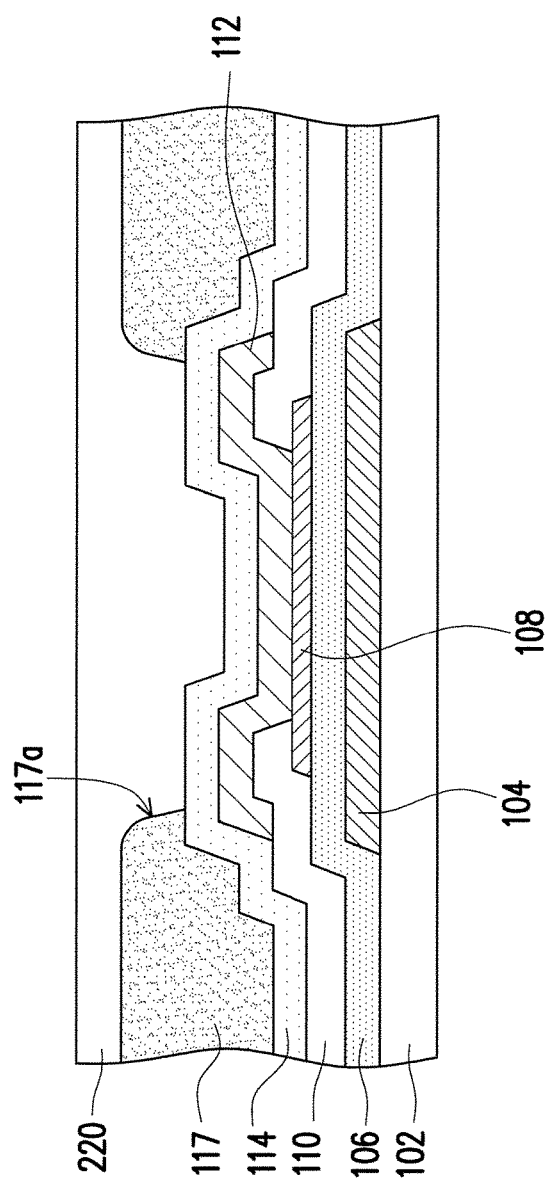
FIGS. 3A to 3D are schematic cross-sectional views showing a fabricating method of a patterned electrode according to another embodiment of the invention.
Figure 3B:
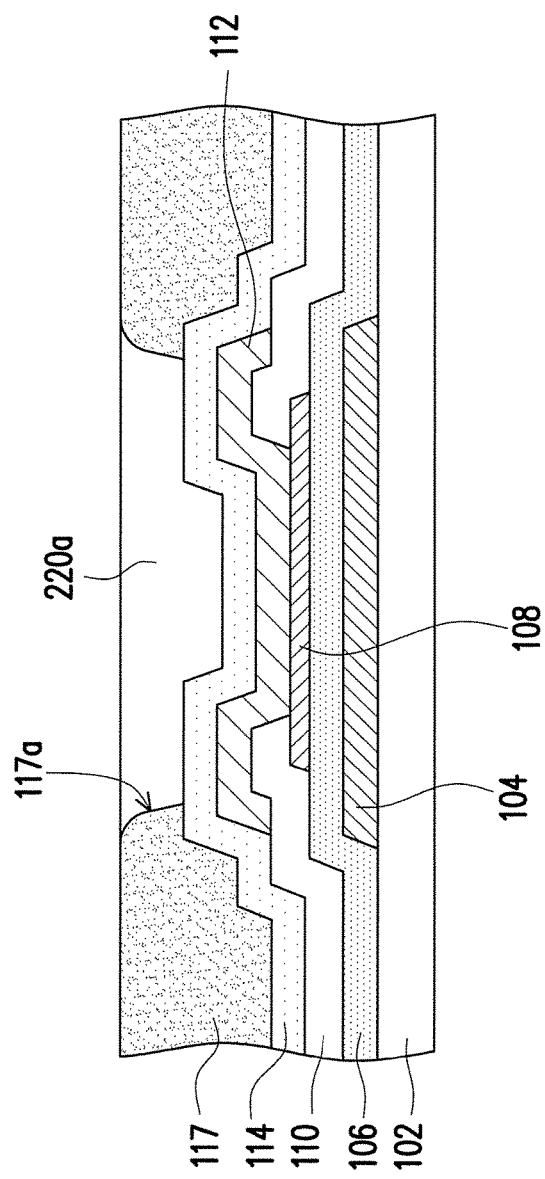

With reference to FIGS. 3A and 3B, a positive photoresist material layer 220 is formed on the patterned overcoating layer 117 and fills up an opening 117a. In some embodiments, the positive photoresist material layer 220 may be formed using spin coating, but the invention is not limited thereto. Then, in some embodiments, the positive photoresist material layer 220 on the patterned overcoating layer 117 may be removed by an ashing process to form a positive photoresist layer 220a. For example, the ashing process may be performed in an environment containing oxygen to remove the positive photoresist material layer 220 having a thickness of about 1.5 μm on the patterned overcoating layer 117 so as to form the positive photoresist layer 220a. In some other embodiments, a film loss of the positive photoresist material layer 220 may be adjusted by controlling parameters of an exposure and development process, so that the positive photoresist material layer 220 on the patterned overcoating layer 117 may be removed to form the positive photoresist layer 220a. In addition, when the positive photoresist material layer 220 is removed by the exposure and development process, not only is the positive photoresist material layer 220 on the patterned overcoating layer 117 is removed, but a portion of the positive photoresist material layer 220 inside the opening 117a is removed as well. In other words, the positive photoresist layer 220a formed by this method has a top surface smaller than or equal to the top surface of the patterned overcoating layer 117.

Figure 3C:
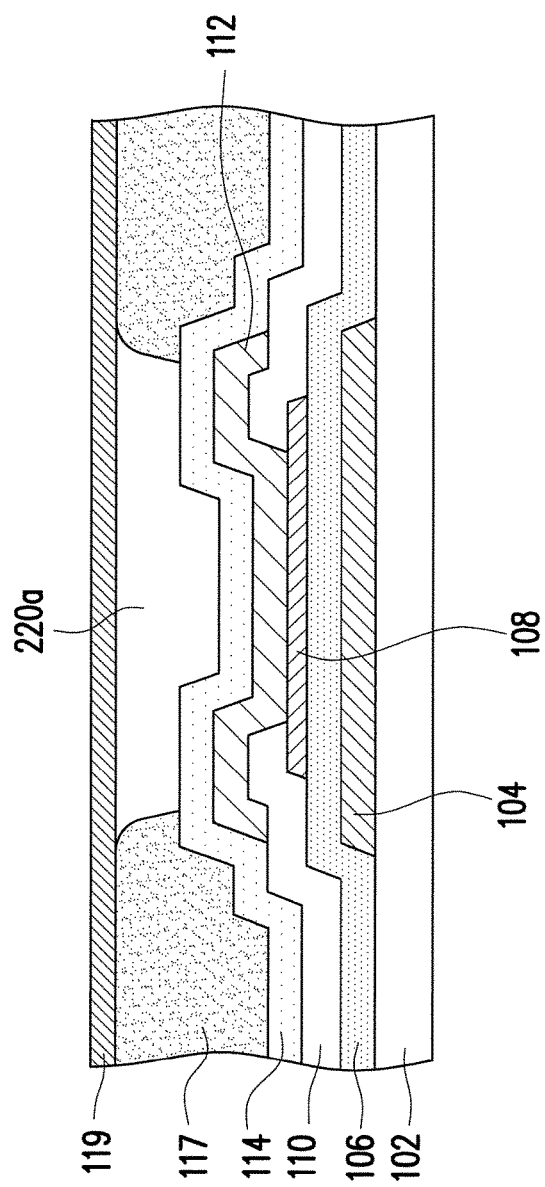
Figure 3D:
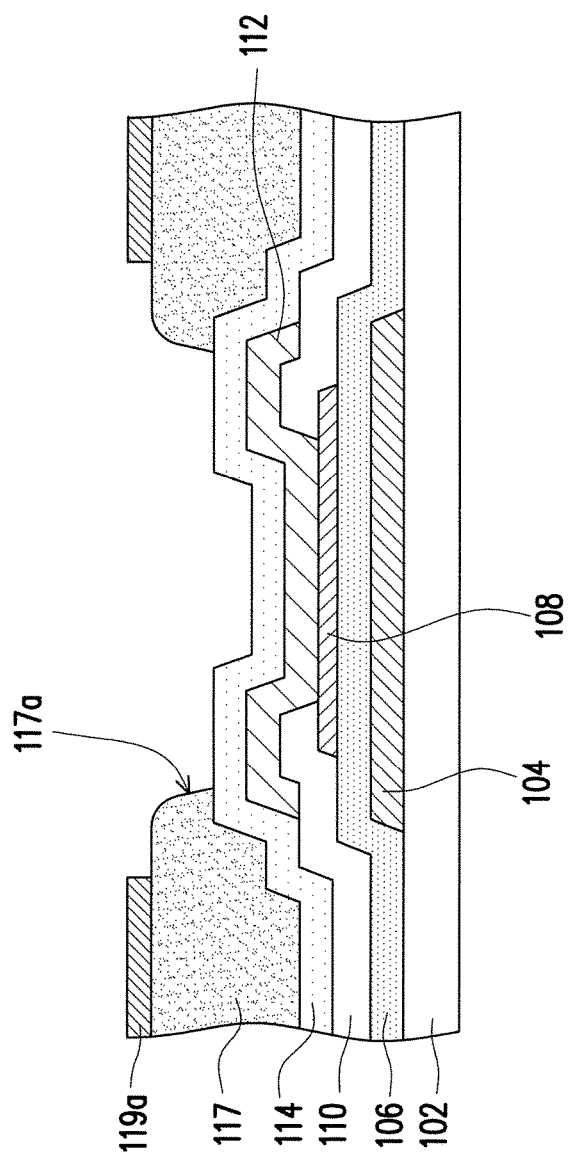

With reference to FIGS. 3C and 3D, an electrode 119 is formed on the patterned overcoating layer 117 and the positive photoresist layer 220a. Then, the positive photoresist layer 220a is removed by a lift-off process, so that the electrode 119 on the positive photoresist layer 220a is also removed simultaneously to form the patterned electrode 119a. For example, when the lift-off process is performed, the positive photoresist layer 220a absorbs a stripper used in the lift-off process to cause swelling, so that the electrode 119 located at the opening 117a may be directly broken up to form the patterned electrode 119a. In addition, even if the sidewalls of the patterned electrode 119a has a relatively irregular shape adjacent to the opening 117a, but it is not greatly affected because the patterned electrode 119a is relatively thinner. Besides, the lift-off condition may be adjusted by controlling the depth of the positive photoresist layer 220a in the opening 117a.

In the following, a fabricating method of forming a patterned electrode 119a on the patterned overcoating layer 117 is described with reference to FIGS. 4A to 4D according to another embodiment of the invention. FIGS. 4A to 4D are schematic cross-sectional views showing a fabricating method of forming the patterned electrode 119a according to another embodiment of the invention.

Figure 4A:
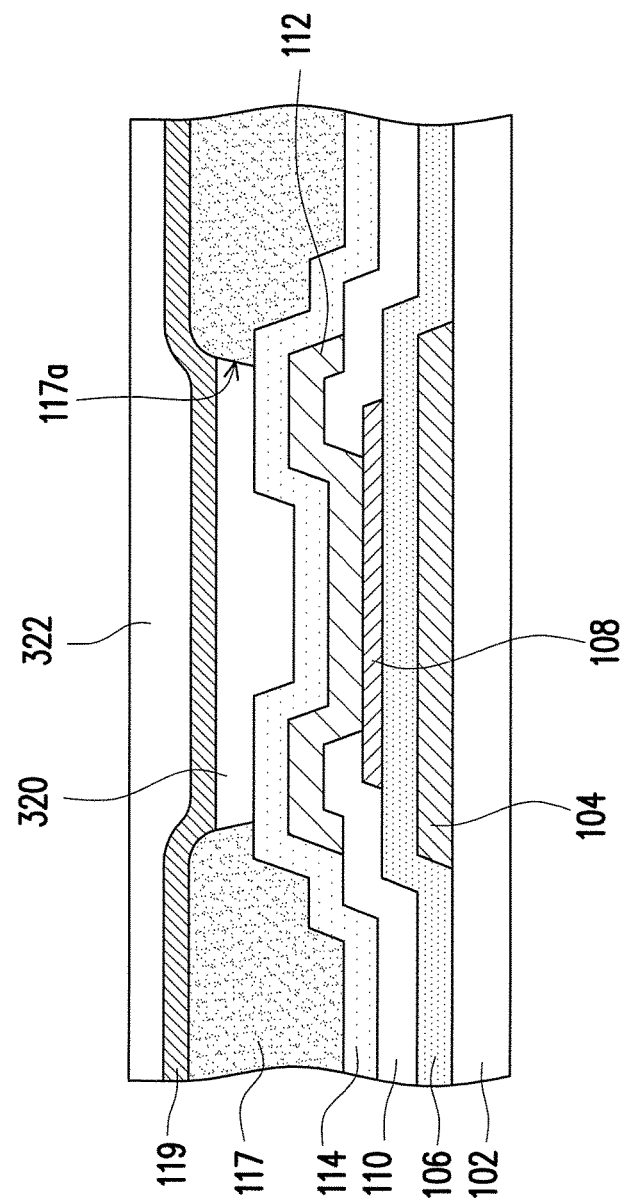
FIGS. 4A to 4D are schematic cross-sectional views showing a fabricating method of a patterned electrode according to another embodiment of the invention.

With reference to FIG. 4A, a first positive photoresist layer 320 is filled in an opening 117a. In some embodiments, the first positive photoresist layer 320 may fill up the opening 117a so that the top surface of the first positive photoresist layer 320 and the top surface of the patterned overcoating layer 117 are coplanar. In some other embodiments, the top surface of the first positive photoresist layer 320 may also be slightly lower than the top surface of the patterned overcoating layer 117. Besides, the material and fabricating method of the first positive photoresist layer 320 may be similar to those of the forgoing positive photoresist layer 220a, and repeated descriptions are omitted here. Then, an electrode 119 is formed on the patterned overcoating layer 117 and the first positive photoresist layer 320. Next, a second positive photoresist layer 322 is formed on the electrode 119. In some embodiments, the material and fabricating method of the second positive photoresist layer 322 may be similar to those of the forgoing positive photoresist layer 220a, and repeated descriptions are omitted here.

Figure 4B:
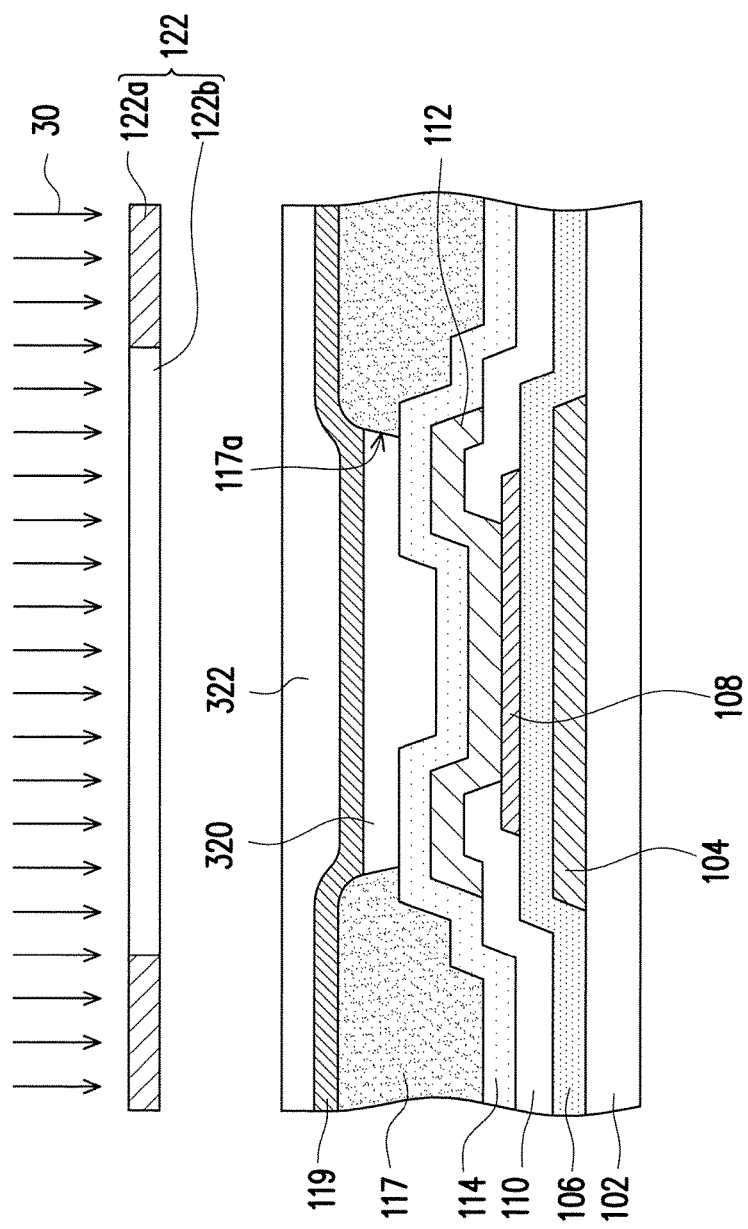
Figure 4C:
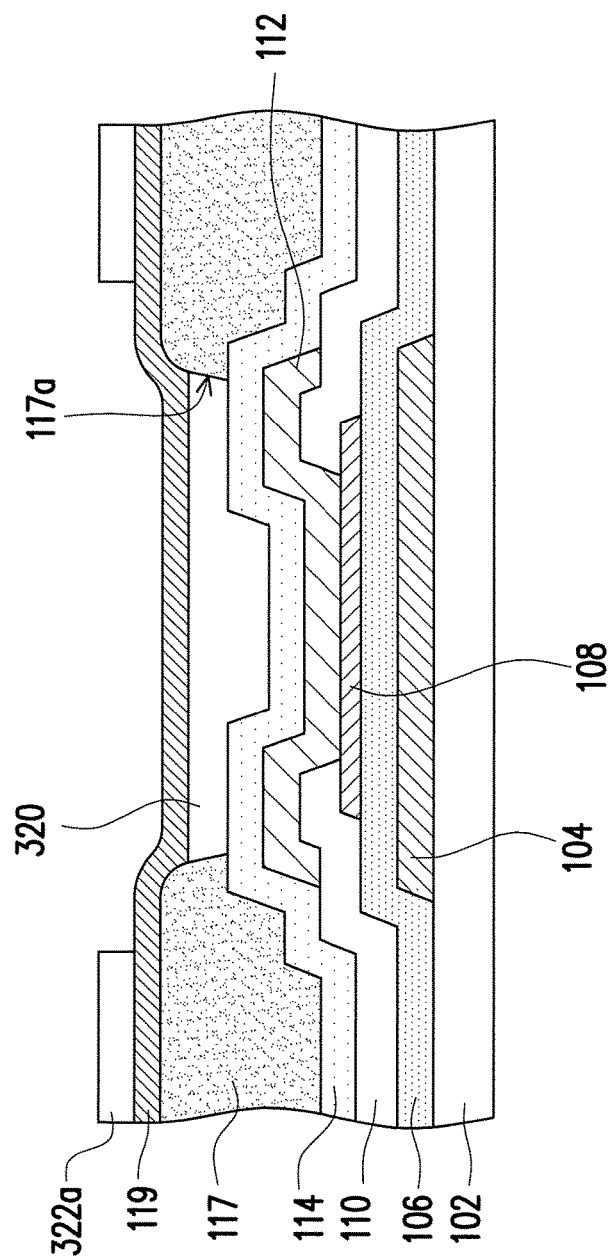

With reference to FIGS. 4B and 4C, a patterning process is performed on the second positive photoresist layer 322 to form a patterned second positive photoresist layer 322a. Herein the patterned second positive photoresist layer 322a exposes the electrode 119 on the opening 117a. In some embodiments, the method of forming the patterned second positive photoresist layer 322a may include providing a patterned photomask 122 on the second positive photoresist layer 322 first. The patterned photomask 122 includes a light-blocking region 122a and a light-transmitting region 122b, and the light-transmitting region 122b corresponds to the position of the opening 117a while the light-blocking region 122a corresponds to the second positive photoresist layer 322 surrounding the opening 117a. Then, an exposure process 30 is performed on the second positive photoresist layer 322 by the patterned photomask 122, so that a light is irradiated through the light-transmitting region 122b to the second positive photoresist layer 322 that corresponds to the position of the opening 117a. Next, a development process is performed on the second positive photoresist layer 322, so that the exposed portion of the second positive photoresist layer 322 is removed to form the patterned second positive photoresist layer 322a. In this way, before the electrode 119 is formed on the patterned overcoating layer 117, the thickness of the second positive photoresist layer 322 to be formed thereon subsequently is reduced by filling the first positive photoresist layer 320 in the opening 117a. Consequently, when the exposure process 30 is performed on the second positive photoresist layer 322, the required exposure may be reduced.

Figure 4D:
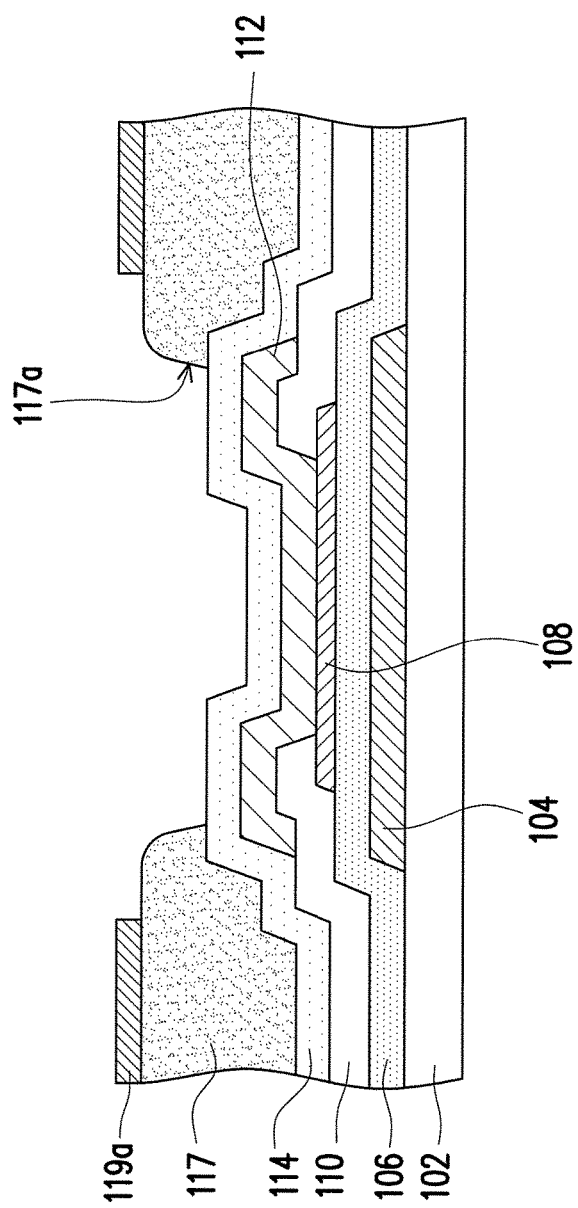

With reference to FIG. 4D, the electrode 119 exposed by the patterned second positive photoresist layer 322a is removed to form the patterned electrode 119a. In some embodiments, the electrode 119 exposed by the patterned second positive photoresist layer 322a may be removed by performing an etching process. The etching process is, for example, dry etching, wet etching, or a combination thereof. Then, after the patterned electrode 119a is formed, the first positive photoresist layer 320 is removed. In some embodiments, the method of removing the first positive photoresist layer 320 is, for example, performing a lift-off process on the first positive photoresist layer 320. In some other embodiments, after the first positive photoresist layer 320 fills up the opening 117a, a vacuum drying process or a baking process is not performed on the first positive photoresist layer 320, so that there are still some solvents or other additives in the first positive photoresist layer 320, resulting in a poor structure thereof. Consequently, after the patterned electrode 119a is formed, the first positive photoresist layer 320 may be removed by a development process.

In summary, in the method for fabricating the planarization layer as described in the foregoing embodiments, before the overcoating layer is formed, the pad layer is formed at the position where the exposure process is to be performed on the overcoating layer so that the overcoating layer there has a thinner thickness, thereby reducing the exposure at the position where the exposure process is to be performed on the overcoating layer. As a result, tact time is saved and productivity is enhanced.

Although the embodiments are already disclosed as above, these embodiments should not be construed as limitations on the scope of the invention. It will be apparent to those skilled in the art that various modifications and variations can be made to the disclosed embodiments without departing from the scope or spirit of this invention. In view of the foregoing, it is intended that the invention covers modifications and variations provided that they fall within the scope of the following claims and their equivalents.

What is claimed is:

1. A method for fabricating a planarization layer, comprising:
    forming an active device on a substrate;
    covering the active device with a passivation layer;
    forming a pad layer on the passivation layer;
    forming an overcoating layer covering the passivation layer and the pad layer on the substrate;
    removing a portion of the overcoating layer and the pad layer by an exposure and development process to form a patterned overcoating layer, wherein the patterned overcoating layer has an opening exposing the passivation layer on a position relative to the active device; and
    after the patterned overcoating layer is formed, forming a patterned electrode on the patterned overcoating layer, wherein the patterned electrode is not formed in the opening.

2. The method for fabricating the planarization layer as recited in claim 1, wherein after the pad layer is formed on the passivation layer, a vacuum drying process or a baking process is not performed on the pad layer.

3. The method for fabricating the planarization layer as recited in claim 1, wherein materials of the overcoating layer and the pad layer are different from each other.

4. The method for fabricating the planarization layer as recited in claim 3, wherein the overcoating layer and the pad layer comprise a photoresist material, wherein light sensitivity of the overcoating layer is A and the light sensitivity of the pad layer is B, and $B/A \geq 7$.

5. The method for fabricating the planarization layer as recited in claim 1, wherein forming the patterned electrode comprises:
    forming an electrode on the patterned overcoating layer and on a surface of the opening;
    covering the electrode with a negative photoresist layer, wherein the negative photoresist layer fills up the opening;
    performing an exposure and development process on the negative photoresist layer to form a patterned negative photoresist layer, wherein the patterned negative photoresist layer exposes the electrode in the opening; and
    removing the electrode exposed by the patterned negative photoresist layer to form the patterned electrode.

6. The method for fabricating the planarization layer as recited in claim 5, wherein a depth of the negative photoresist layer in the opening is t1, a depth of the negative photoresist layer surrounding the opening is t2, and $t1/t2 \geq 2.5$.

7. The method for fabricating the planarization layer as recited in claim 1, wherein forming the patterned electrode comprises:
    filling a positive photoresist layer in the opening;
    forming an electrode on the patterned overcoating layer and on the positive photoresist layer; and
    removing the positive photoresist layer by a lift-off process, so that the electrode on the positive photoresist layer is also removed simultaneously to form the patterned electrode.

8. The method for fabricating the planarization layer as recited in claim 1, wherein forming the patterned electrode comprises:
    filling a first positive photoresist layer in the opening;
    forming an electrode on the patterned overcoating layer and on the first positive photoresist layer;
    forming a second positive photoresist layer on the electrode;
    performing an exposure and development process on the second positive photoresist layer to form a patterned second positive photoresist layer, wherein the patterned second positive photoresist layer exposes the electrode in the opening; and
    removing the electrode exposed by the patterned second positive photoresist layer to form the patterned electrode.

* * * * *